United States Patent [19]

Harrison et al.

[11] 4,308,524
[45] Dec. 29, 1981

[54] FAST HIGH RESOLUTION PREDICTIVE ANALOG-TO-DIGITAL CONVERTER WITH ERROR CORRECTION

[75] Inventors: William D. Harrison; Henry H. Martin, both of Nashville, Tenn.

[73] Assignee: Harrison Systems, Inc., Nashville, Tenn.

[21] Appl. No.: 45,793

[22] Filed: Jun. 5, 1979

[51] Int. Cl.³ .......................................... H03K 13/02
[52] U.S. Cl. ....................... 340/347 AD; 340/347 M
[58] Field of Search .................. 340/347 M, 347 AD; 324/99 D, 78 D, 78 E

[56] References Cited

U.S. PATENT DOCUMENTS

| | | | |
|---|---|---|---|
| 3,072,332 | 1/1963 | Margopoulos | 340/347 M |
| 3,493,958 | 2/1970 | Gorbatenko et al. | 340/347 M |
| 3,495,238 | 2/1970 | Gabriel | 340/347 AD X |
| 3,646,586 | 2/1972 | Kurz | 340/347 M |
| 3,956,746 | 5/1976 | Lisle et al. | 340/347 M |

OTHER PUBLICATIONS

The Engineering Staff of Analog Devices, Inc., Analog-Digital Conversion Handbook, 6/1972, pp. III-78 & III-79, III-1 to III-8.
Verster, A Method to Increase the Accuracy of Fast-Serial-Parallel . . ., IEEE Transactions on Electronic Computers, Aug. 1964, pp. 471-473.

Koeman et al., Error Correction Speeds Up A-D Conversion Tenfold, Electronics, Sep. 2, 1976, pp. 89-93.

Primary Examiner—Thomas J. Sloyan
Attorney, Agent, or Firm—Sughrue, Mion, Zinn, Macpeak & Seas

[57] ABSTRACT

An analog-to-digital conversion system uses a fast analog-to-digital converter having a resolution less than the system resolution to convert the difference between a previously predicted value and the current analog value. The converted difference is summed with the predicted value to compute the actual value of the analog input signal to a resolution greater than that of the fast analog-to-digital converter. The high resolution digital value thus obtained becomes the predicted value for the next conversion. This predicted value is converted by a digital-to-analog converter having the same accuracy but not the same resolution as the system output to an analog signal which is compared with the input analog signal to obtain a difference signal. This difference signal is sampled and held to provide the input to the fast analog-to-digital converter. The system includes a gain scaling and switching circuit to compensate for errors which would occur when the difference between the true analog input and the prediction exceeds the range of the low resolution, fast analog-to-digital converter.

12 Claims, 6 Drawing Figures

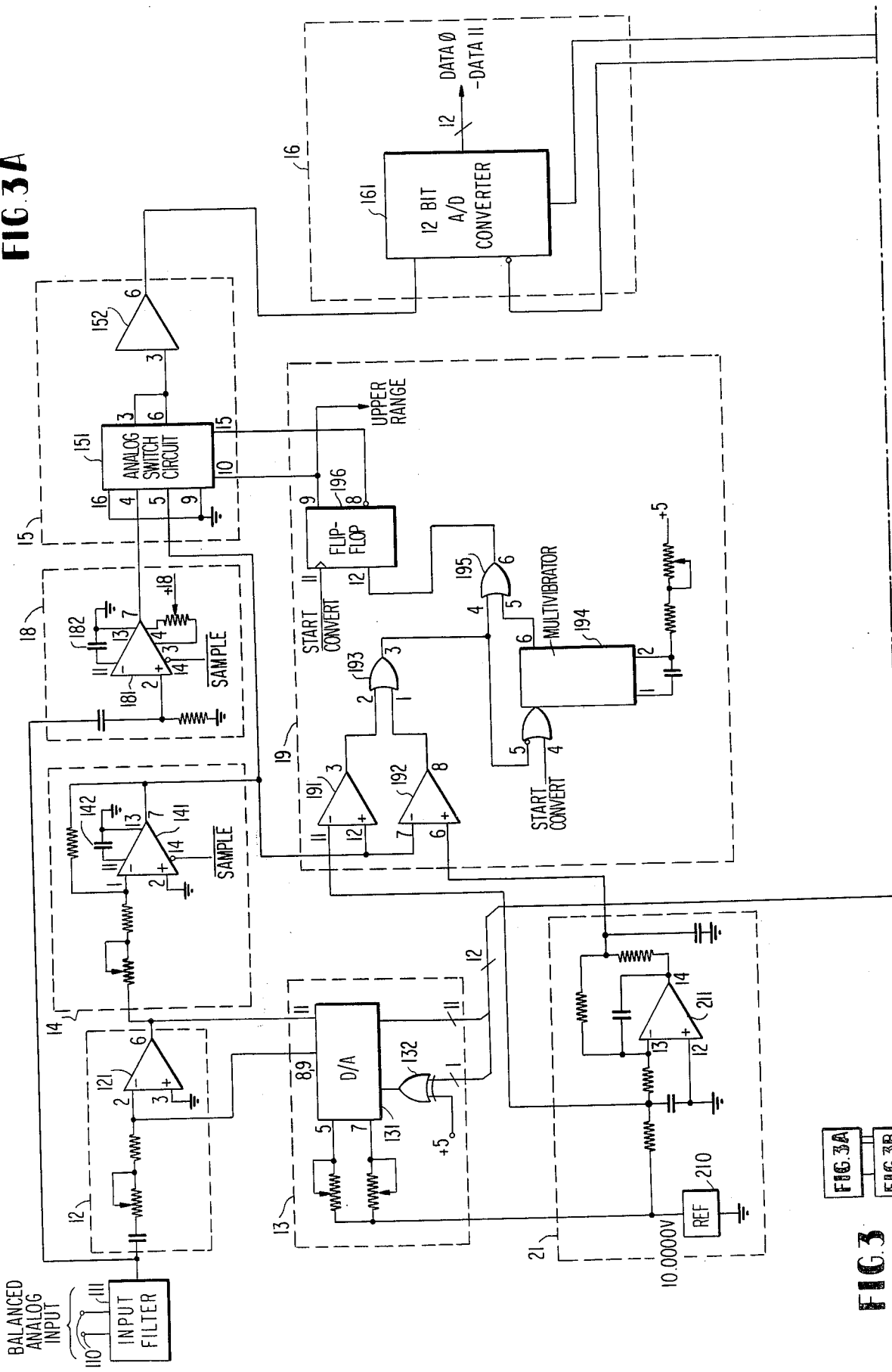

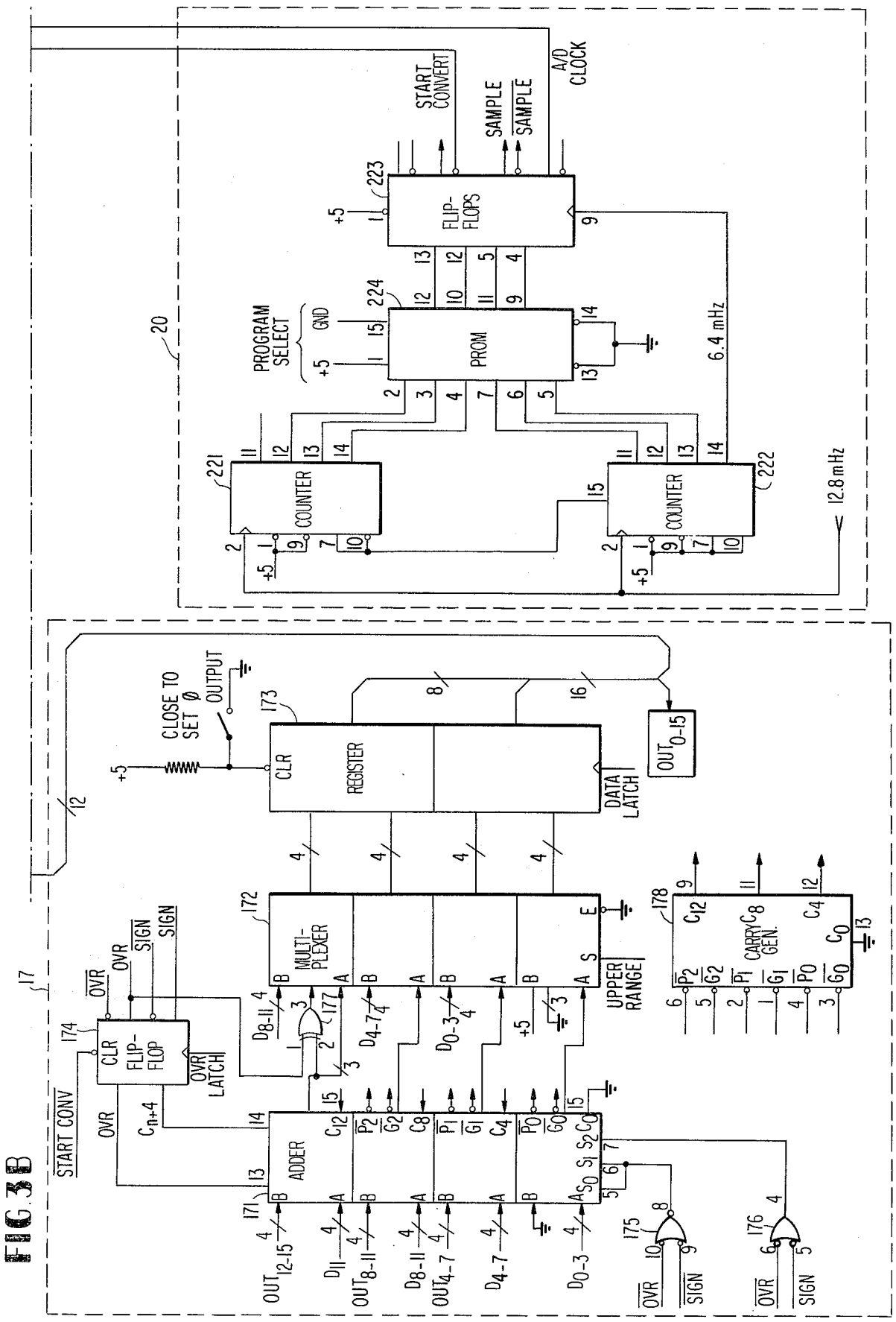

FAST HIGH RESOLUTION PREDICTIVE ANALOG-TO-DIGITAL CONVERTER WITH ERROR CORRECTION

BACKGROUND OF THE INVENTION

The present invention generally relates to analog-to-digital converters, and more particularly to an improved analog-to-digital converter which provides a very high resolution conversion of very rapidly changing analog signals into a quantized digital form.

Historically, very high speed analog-to-digital converters have used parallel conversion techniques. Examples of these are described in U.S. Pat. No. 2,869,079 to Stallin et al. and U.S. Pat. No. 3,597,761 to Fraschilla et al. While such converters are extremely fast, the parallel technique requires an individual comparator and reference for each of the individual levels possible in the output data word. As a practical matter, such conversions are limited to relatively low resolution applications since the number of comparators required increases exponentially with the number of bits converted.

Very high resolution analog-to-digital conversions have used ramp or slope type converters. While these converters are very accurate, they tend to be slow and are used primarily for slowly varying quantities. The most common form of converter used for high speed, high resolution analog-to-digital conversions is the successive approximation form. An example of this type of conversion is described in U.S. Pat. No. 3,781,871 to Mattern. There are basically two limitations inherent in this type of converter. First, the successive approximation analog-to-digital converter is required to allow one full settling time of the digital-to-analog converter comparator combination to the full resolution of the complete system for each bit to be converted. Second, the successive approximation analog-to-digital converter must be supplied with a non-varying signal during its conversion sequence. This means that the converter must be preceded by an analog sample and hold amplifier. The sample and hold amplifier must meet and preferably exceed the accuracy of the converter itself.

SUMMARY OF THE INVENTION

It is therefore an object of the present invention to provide a high speed, high resolution analog-to-digital converter that significantly reduces the errors associated with sample and hold amplifiers and the errors caused by the settling time of the digital-to-analog converter comparator combination.

It is another object of the present invention to provide an analog-to-digital converter which is capable of converting a rapidly changing analog signal into a very high resolution quantized digital form which may be processed, stored and later converted back to an analog signal without significant signal degradation.

It is a further object of this invention to provide a relatively inexpensive analog-to-digital converter capable of providing very high resolution conversion of very rapidly changing analog signals into a quantized digital form.

These and other objects of the invention are accomplished by using a fast analog-to-digital converter whose resolution is less than the system resolution to convert the difference between a previously predicted value and the current analog value. More specifically, the analog-to-digital conversion system according to the present invention performs actual conversions on an error signal that is the difference between the actual analog input and a predicted or assumed quantity, and uses the converted difference along with the predicted or assumed quantity to compute the value of the analog input signal. The input to the fast analog-to-digital converter is provided by a sample and hold amplifier which stores the difference signal. In most cases, the difference signal is significantly less than the analog input signal itself, therefore, the accuracy requirements imposed on the sample and hold amplifier are greatly reduced. In its broadest form, the analog-to-digital conversion system according to the invention includes an analog differencing circuit, a low resolution fast analog-to-digital converter, digital prediction and computation logic, and a high accuracy, low resolution digital-to-analog converter. The digital-to-analog converter generates an analog signal representing the predicted value of the input analog signal, and this signal together with the actual input analog signal are combined in the analog differencing circuit to produce an error signal. This error or difference signal is sampled and held by the sample and hold amplifier to provide an input to the low resolution fast analog-to-digital converter. In the specific embodiment to be described hereinafter, the fast analog-to-digital converter has only a twelve bit resolution while the converter system has a sixteen bit resolution. In normal operation, the fast analog-to-digital converter produces the twelve least significant bits of the input to the digital prediction and computation logic. This logic basically comprises a sixteen bit accumulator which adds the output of the fast analog-to-digital converter to the previously accumulated value. The output of the sixteen bit accumulator is both the digital output of the converter system and the input to the digital-to-analog converter. To further enhance the speed and increase the economy of the system, the digital-to-analog converter is a twelve bit converter receiving the twelve most significant bits from the output of the sixteen bit accumulator.

If the predicted value is wrong to the extent that the difference between the true analog input and the prediction exceeds the range of the low resolution fast analog-to-digital converter, gross output errors can result until the difference comes within the range of the fast analog-to-digital converter. In order to compensate for this, the invention is provided with switchable gain scaling that provides excellent recovery and little signal degradation. This gain scaling is accomplished by providing two sample and hold amplifiers, a level detector and a selector switch. In the specific embodiment disclosed, one sample and hold amplifier has a gain of sixteen and samples the output of the analog differencing circuit. The other sample and hold amplifier has a gain of one and samples the actual analog input signal itself. The outputs of these two sample and hold amplifiers are provided to the selector switch which, under the control of the level detector, provides one or the other of the sample and hold amplifier outputs to the fast analog-to-digital converter for quantization. The level detector receives the output of the sample and hold amplifier having a gain of sixteen and determines whether or not the difference signal amplitude is too great to be quantized by the twelve bit analog-to-digital converter. If the amplitude is within the range of the fast analog-to-digital converter, the output of the sample and hold amplifier having a gain of sixteen is provided by means of the selector switch to the input of the fast analog-to-digital converter. On the other hand, should the amplitude of the difference signal be too large, the selector switch is controlled by the level detector to provide the output of the sample and hold amplifier having a gain of one to the input of the fast analog-to-digital converter. The level detector also provides a control signal to the digital prediction and computation logic. More specifically, when the output of the sample and hold amplifier having a gain of sixteen is selected, the digital prediction and computation logic first divides the output of the fast analog-to-digital converter by sixteen to thereby correct for the gain ranging of the selected sample and hold amplifier. When the output of the sample and hold amplifier having a gain of one is selected as the input to the fast analog-to-digital converter, this division by sixteen in the digital prediction and computation logic is not performed.

BRIEF DESCRIPTION OF THE DRAWINGS

The foregoing and other objects, advantages and aspects of the invention will be better understood from the following detailed description of a preferred embodiment of the invention with reference to the accompanying drawings, in which:

FIG. 3, comprising FIGS. 3A and 3B, is a detailed schematic and block diagram showing an actual implementation of the preferred embodiment of the invention.

DESCRIPTION OF THE PREFERRED EMBODIMENT

The present invention was motivated by a need to convert professional quality audio signals into a quantized digital form for processing, storage, and later conversion back to analog without significant signal degradation. Such professional quality audio signals are characterized as being rapidly changing analog signals having a wide dynamic range. It has been determined that to meet the requirements of fast, high speed conversion for this particular application, quantization should be at a minimum of 50 KHz rate (20 $\mu$sec. intervals) with a minimum of sixteen bit binary resolution. While motivated by these particular audio requirements, the converter system which is described hereinbelow is not limited to this particular application but may find wide application in many different fields.

Figure 1:
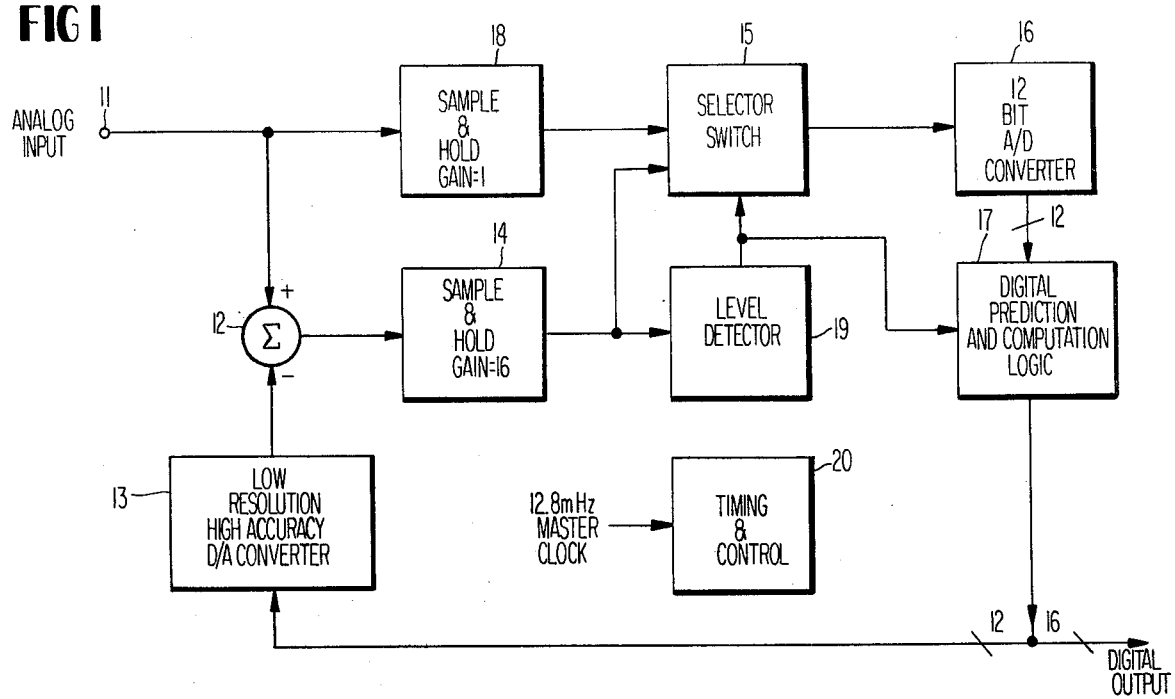
FIG. 1 is a block diagram of the preferred embodiment of the analog-to-digital converter system according to the present invention.

Referring now to FIG. 1 of the drawings, the input analog signal is applied to input terminal 11 which is connected to the positive input of an analog differencing circuit 12. The negative input of the analog differencing circuit 12 is provided by a low resolution, high accuracy digital-to-analog converter 13. The output of converter 13 is a predicted analog value which is compared with the actual input analog value to provide an error or difference output signal to the sample and hold amplifier 14. The sample and hold amplifier 14 has a gain of sixteen to provide an amplified sampled error signal output. In normal operation, the error or difference signal from the analog differencing circuit 12 is substantially less than the input analog signal applied to terminal 11. By amplifying the error signal, the resolution of that signal is enhanced.

A selector switch 15 is operative to selectively connect the output of the sample and hold amplifier 14 to the input of a twelve bit analog-to-digital converter 16. Since the system resolution is sixteen bits, the analog-to-digital converter 16 may be described as a low resolution fast converter. In addition, since the error or difference voltage is amplified in the sample and hold amplifier 14, the analog-to-digital converter 16 has an output having improved resolution. This is because the amplified error or difference signal is converted as a high level signal by the analog-to-digital converter 16.

The output of the analog-to-digital converter is a two's complement quantity expressed by twelve parallel bits which are supplied to the digital prediction and computation logic 17. The logic of 17 provides a digital gain scaling and includes an accumulator which adds the output of the analog-to-digital converter 16 to a previously accumulated value in a manner which prevents an overflow from occurring. The accumulator in the digital prediction and computation logic 17 has sixteen stages providing a sixteen bit output. This output is both the digital output of the analog-to-digital converter system and also the predicted value which is fed back to the digital-to-analog converter 13 having only twelve bit resolution. To maintain best performance, the digital-to-analog converter 13 must be selected to the accuracy desired for the analog-to-digital converter system. Since the digital-to-analog converter 13 has only twelve bit resolution, it receives only the twelve most significant bits of the output from the prediction and computation logic 17. The use of this lower resolution digital-to-analog converter as the feed back or prediction element in the system has the advantages of simultaneously decreasing the cost of implementation and allowing the converter system to operate at a much higher speed.

It will be appreciated that both the digital-to-analog converter 13 and the analog-to-digital converter 16 are twelve bit converters. There is, however, a distinction that should be appreciated at this point in the description. Whereas the digital-to-analog converter 13 receives the twelve most significant bits from the accumulator in the digital prediction and computation logic 17, the analog-to-digital converter 16 provides an output which is normally related to the least significant bits of the accumulator. With gain scaling, this corresponds to the twelve least significant bits in the accumulator.

The worst problem with differential converters is that they cannnot properly encode signals which change amplitude very rapidly. When such signals are presented, the difference signal amplitude is greater than the maximum allowable input to the low resolution analog-to-digital converter 16. In the embodiment shown in FIG. 1, this is corrected by gain scaling. More particularly, a second sample and hold amplifier 18 having a gain of one is connected to the input terminal 11 to sample the input analog signal directly. The output of this sample and hold amplifier 18 is also provided to the selector switch 15. The output of the sample and hold amplifier 14 is provided to the level detector 19. Under the control of timing and control logic 20, both sample and hold amplifiers 14 and 18 are placed in the sample mode long enough to allow their respective outputs to settle to the proper value. The level detector 19 determines whether or not the amplified difference signal amplitude is too great for the twelve bit analog-to-digital converter 16. Unless the amplitude is too large, the level detector 19 controls the selector switch 15 to connect the output of sample and hold amplifier 14 to the input of analog-to-digital converter 16. On the other hand, if the amplitude of the amplified difference signal is too large, the selector switch 15 is controlled by the level detector 19 to connect the output of sample and hold amplifier 18 to the input of analog-to-digital converter 16.

The level detector 19 also provides a control input to the digital prediction and computation logic 17. If the sampled difference signal from sample and hold amplifier 14 is selected as the input to the analog-to-digital converter 16, the output of converter 16 is first divided by sixteen to correct for the gain scaling of the sample and hold amplifier 14. This digital gain scaling is accomplished simply by shifting the twelve bit output of the converter 16 to the right four places. After this digital gain scaling, the result is added in the accumulator to the previously accumulated value to provide the new value which is both the output and the predicted value for the next analog input sample.

If the sampled input signal from sample and hold amplifier 18 is selected as the input to analog-to-digital converter 16, the output of the converter 16 is the digitized output. Because only a twelve bit conversion is performed, the value assigned to the lower four output bits is arbitrary. No digital gain scaling is required since the gain of sample and hold amplifier is one. With this arrangement, the output read into the accumulator is midway between two adjacent possibilities for the actual input. As a result, excellent recovery with little signal degradation is achieved for signals having a wide dynamic range. After allowing time for the digital-to-analog converter 13 to settle, the next cycle under the control of the timing and control circuit 20 is begun.

Figure 2:
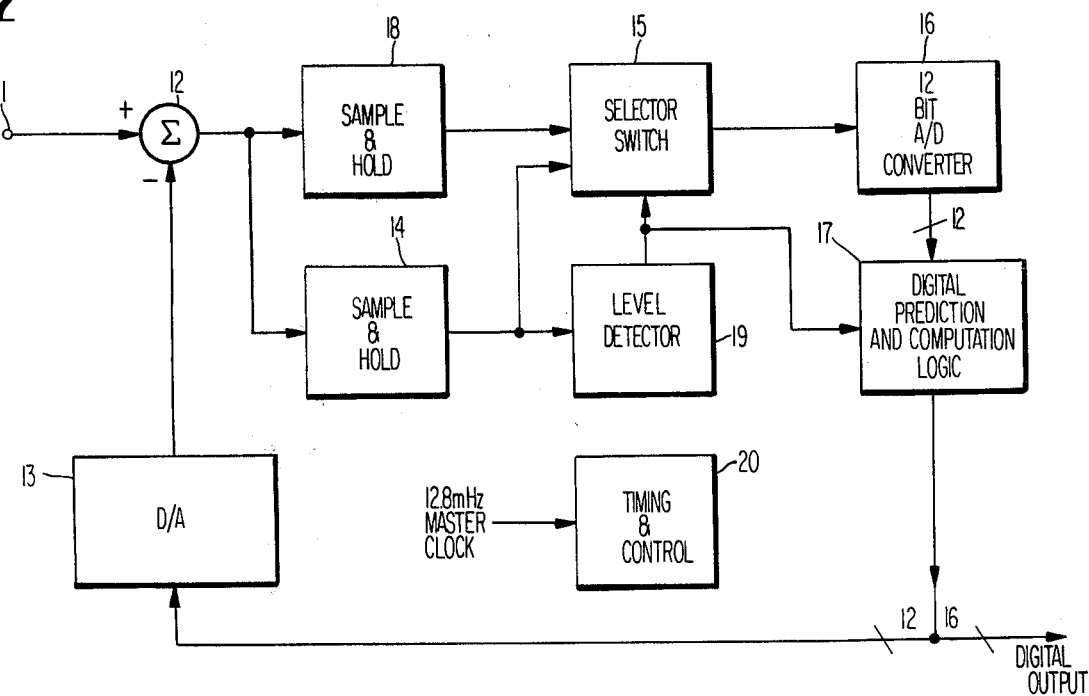
FIG. 2 is a block diagram showing a modification of the preferred embodiment of the invention.

A modification of the embodiment shown in FIG. 1 is shown in FIG. 2 wherein like reference numerals designate identical or corresponding parts in the two figures. According to the modification shown in FIG. 2, the input to the sample and hold amplifier 18 is connected to the output of the analog differencing circuit 12 instead of to the input terminal 11. In the worst case, this difference signal would have an amplitude equal to or twice that of the input signal. Therefore, sample and hold amplifier 18 attenuates the difference signal by a factor of two to provide an output which is within the range of the analog-to-digital converter 16. The digital prediction and computation logic must also be modified to multiply the digital output of the analog-to-digital converter 16 by two before adding it to the previously accumulated value. Although the operation of the modification shown in FIG. 2 is quite similar to that of the preferred embodiment shown in FIG. 1, it has the disadvantages of decreased resolution in the conversion of over range signals and of increased complexity in the digital prediction and computation logic.

FIG. 3 shows an actual implementation of the preferred embodiment shown in FIG. 1. A pair of input terminals 110 are provided to receive a balanced analog input. The input terminals 110 are connected to the input of a filter 111 for suppressing signal components above the Nyquist frequency (half the sampling frequency) to prevent their aliasing as components within the normal signal frequencies. The filter 111 while having a balanced input, provides a single-ended output to the analog differencing circuit 12. The analog differencing circuit comprises an operational amplifier 121 which may be a type HA-2525 integrated circuit manufactured by Harris Semiconductor. The output of the input filter 111 is connected through a compensating RC circuit to the negative input terminal of operational amplifier 121. The positive input terminal of operational amplifier 121 is grounded. The output of operational amplifier 121 is connected to the sample and hold amplifier 14. The sample and hold amplifier 14 is comprised of a gated operational amplifier 141 having a capacitor 142 connected as the storage element. The output of operational amplifier 121 is connected through an adjustable resistive network to the negative input terminal of gated operational amplifier 141, while the positive input of gated operational amplifier 141 is connected to ground. The gating signal to the gated operational amplifier 141 is supplied by the timing and control circuitry 20.

The output of operational amplifier 141 is supplied to one input of the selector switch 15. The selector switch 15 is comprised of an analog switching circuit 151 which may be a CMOS analog dual SPST switch type HI-5043 integrated circuit manufactured by Harris Semiconductor. The output of switch 151 is connected by way of buffer and isolation amplifier 152 to the input of the fast twelve bit analog-to-digital converter 16. The analog-to-digital converter 16 comprises a twelve bit converter 161 of known type. In the preferred embodiment, the converter 161 may comprise a type HI-562 digital-to-analog converter manufactured by Harris Semiconductor as a feed back element to a comparator, the output of which is supplied to a successive approximation register. Other commercially available analog-to-digital converters can, of course, be used.

The twelve bit parallel output of the analog-to-digital converter 161 is supplied to the digital prediction and computation logic 17. The logic 17 comprises a sixteen bit parallel arithmetic logic unit (ALU) including an adder and overflow detection and sign correction logic, a sixteen channel digital multiplexer and a sixteen bit output register. The sixteen bit parallel adder 171 may be composed of three four bit adders type SN74LS381, one four bit adder type SN74LS383 and one look ahead carry generator 178 type SN74S182 integrated circuits manufactured by Texas Instruments. When used in conjunction with these particular adders, the overflow detection and correction logic 174, 175, 176 and 177 may be composed of one dual flip-flop type SN74LS74, and one quarter each of an Exclusive OR gate type SN74LS86, an OR gate type SN74LS32 and a NOR gate type SN74LS02 integrated circuits manufactured by Texas Instruments. The sixteen bit output from the adder 171 is supplied to a multiplexer 172 which provides a sixteen bit output to an output register 173. The multiplexer 172 may be composed of four type SN74LS157 integrated circuits manufactured by Texas Instruments. The register 173 may be composed of two octal D-type flip-flops typs SN74LS273 integrated circuits manufactured by Texas Instruments. The sixteen bits provided at the output of the register 173 are identified as OUT 0 to OUT 15, while the twelve bit outputs of the analog-to-digital converter 161 are identified as DATA 0 to DATA 11. These outputs are connected to the inputs of the parallel adder 171 and the multiplexer 172 as shown in FIG. 3. The multiplexer 172 is controlled by the output of the level detector 19 to select either the output of the parallel adder 171 or the output of the analog-to-digital converter 161 to supply to the register 173.

The twelve most significant bits of the output of register 173 identified as OUT 4 to OUT 15 are supplied to the low resolution, high accuracy digital-to-analog converter 13. The converter 13 may comprise a digital-to-analog converter 131 type HI-562 (selected for greater than twelve bit accuracy) manufactured by Harris Semiconductor. This digital-to-analog conveter requires (as do most such circuits) that the most significant bit OUT 15 be inverted to convert the digital code from two's complement notation to offset binary notation. The required inversion may be performed by one quarter of an Exclusive OR gate type SN74LS86 manufactured by Texas Instruments. The reference voltage for the digital-to-analog converter 131 is supplied by a reference voltage generator 21 which may include a precision voltage reference 210, type REF01 manufactured by Precision Monolithics. The analog current signal developed by the digital-to-analog converter 131 is supplied to the negative input of operational amplifier 121 which comprises the analog differencing circuit 12.

The output of the input filter 111 is also connected to the sample and hold amplifier 18. This sample and hold amplifier is comprised of a gated operational amplifier 181 having a capacitor 182 connected as the storage element. This amplifier 181 has a gain of one and may comprise a type SMP-81 integrated circuit manufactured by Precision Monolithics. The input from input filter 111 is connected through an RC compensation network to the positive input of the gated operational amplifier 181, and the output of the gated operational amplifier 181 is connected to one input of the switching circuit 151.

The output of gated operational amplifier 141 is also supplied to the level detector 19. The level detector 19 comprises a pair of comparators 191 and 192. The positive input of comparator 191 and the negative input of comparator 192 are connected in common to the output of gated operational amplifier 141. The negative input of comparator 191 is connected to a source of positive voltage developed from the precision voltage reference 210. The precision voltage reference 210 also supplies operational amplifier 211 which develops a negative voltage reference which is supplied to the positive input terminal of comparator 192. Operational amplifier 211 may be a type HA-4741 integrated circuit manufactured by Harris Semiconductor, and comparators 191 and 192 may each be type HA-4905 integrated circuits also manufactured by Harris Semiconductor. The outputs of comparators 191 and 192 are connected to repective inputs of a dual input OR gate 193. As long as the output of gated operational amplifier 141 is between the voltage limits supplied to the negative input of comparator 191 and the positive input of comparator 192, the outputs of both of comparators 191 and 192 will have a logic level of "zero" so that a "zero" output is provided by the OR gate 193. However, should the output of gated operational amplifier 141 exceed either the positive or negative voltage reference levels supplied to the comparators 191 and 192, a logic level "one" will be produced by the corresponding comparator resulting in a logic "one" being provided at the output of the OR gate 193. The output of OR gate 193 is supplied to a retriggerable, resettable monostable multivibrator 194 and to one input of dual input OR gate 195. Monostable multivibrator 194 may be a type 9602 integrated circuit manufactured by Fairchild Camera & Instrument. When the input to monostable multivibrator 194 is a logic "one" during the time of the "start convert" pulse generated by timing control circuitry 20, the output of the monostable multivibrator 194 will be set to a logic "one" for a period of time determined by the RC network attached to monostable multivibrator 194. The output of the monostable multivibrator 194 is supplied to the other input of OR gate 195. The output of OR gate 195 is supplied to a flip-flop 196 which may be a type SN74LS74 integrated circuit manufactured by Texas Instruments. At each occurrence of the "start convert" pulse, the output of flip-flop 196 will be set equal to that of OR gate 195. When the flip-flop 196 is set, it provides an output to the selector switch 151 to connect the output of gated operational amplifier 181 to the input of analog-to-digital converter 161. At the same time, the output of flip-flop 196 causes the multiplexer 172 to supply the twelve bit output of the analog-to-digital converter 161 directly to the twelve most significant stages of the register 173. The monostable multivibrator 194 has a time constant longer than one conversion interval to prevent rapid cyclical alterations in the selection between the sampled input and sampled error signals.

Figure 4:
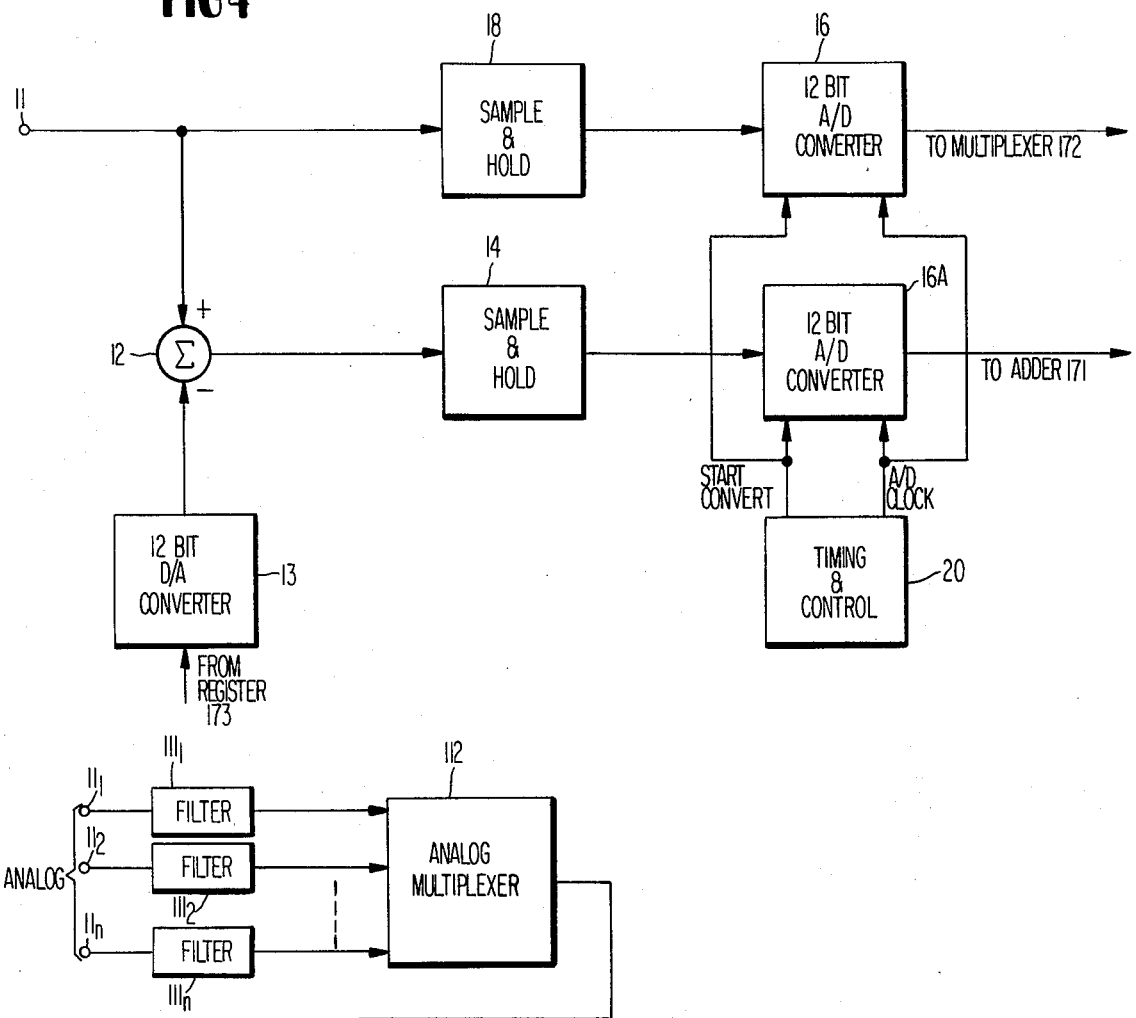
FIGS. 4 and 5 are block diagrams showing other modifications of the preferred embodiment of the invention.

A slight modification is possible to the preferred embodiment which, while raising the cost of the analog-to-digital conversion system, would also allow a slight increase in speed. In this modification, selector switch 15 would be removed from the system, and the outputs from sample and hold amplifiers 18 and 14 would directly feed the inputs of two low resolution high speed analog-to-digital converters 16 and 16A, respectively, as shown in FIG. 4. Both analog-to-digital converters would receive in parallel the "start convert" pulse and the "A/D clock" and so would simultaneously convert their respective inputs. The twelve bit output from analog-to-digital converter 16 would feed the sixteen channel multiplexer 172, while the twelve bit output of analog-to-digital converter 16A would feed the sixteen bit parallel adder 171. The decision to use either the direct signal or the summation of the predicted value and the converted error could still be done by the level detector 19 or in a digital circuit using the output of analog-to-digital converter 16A.

Besides the "start convert" pulse, the timing control circuitry 20 provides the "sample" gating signal to the gated operational amplifiers 141 and 181, the "A/D clock" to the analog-to-digital converter 161 and the "OVR latch" to overflow detection logic 174. The analog-to-digital converter 161 also receives the initializing "start convert" pulse from the timing and control circuitry. While the timing and control circuitry 20 may take any conventional form, this circuitry as shown in FIG. 3 comprises two synchronous four-bit counters 221 and 222. These counters are connected to receive an input 12.8 MHz clock and are connected in cascade to form an eight-bit counter. The first stage of counter 222 provides an output 6.4 MHz clock signal which is provided to gated timing and control circuit 223. The four-bit counters 221 and 222 may be type SN74LS163 integrated circuits manufactured by Texas Instruments, and the circuit 223 may be a quad D-type flip-flop type SN74LS175 integrated circuit also manufactured by Texas Instruments. The flip-flops in the circuit 223 are selected by a programmable read only memory (PROM) 224 which is addressed by the outputs of the counters 221 and 222. The PROM 224 may be a type HM-7611 integrated circuit manufactured by Harris Semiconductor. This PROM provides the same function that decoding logic normally provides in such timing and control circuits. In other words, depending on the count accumulated by the counters 221 and 222, specific flip-flops in circuit 223 will be set to provide the output timing and control pulses for the converter system.

Figure 5:
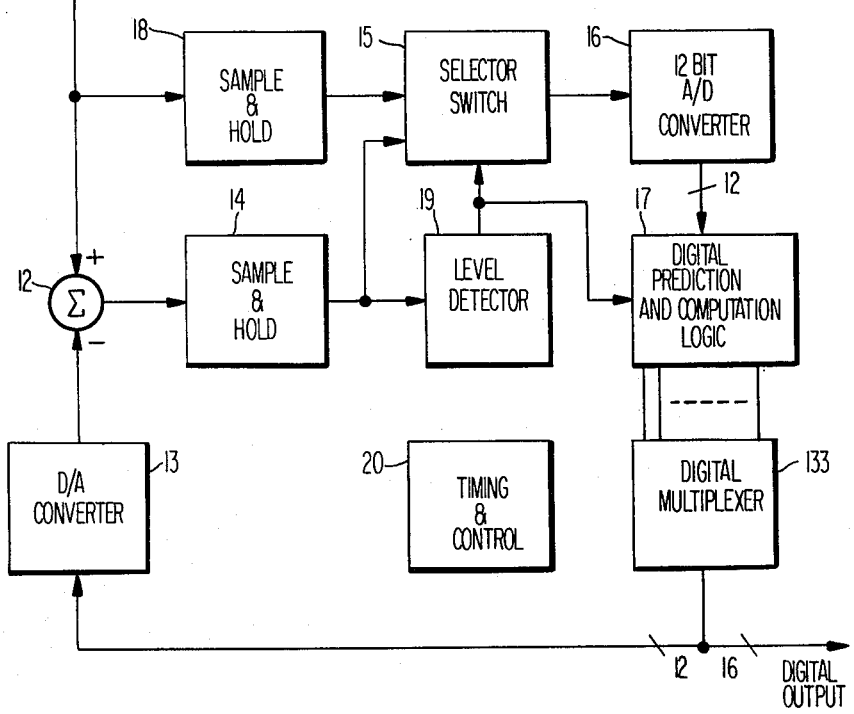

While the invention has been described in terms of a preferred embodiment and that preferred embodiment has been illustrated in a specific implementation, those skilled in the art will recognize that the invention can be practiced using different circuitry and modifications within the scope of the appended claims. What the invention provides is an analog-to-digital conversion system in which the actual conversions are made on an error signal that is the difference between the actual analog input and a predicted or assumed quantity. This permits the use of a fast analog-to-digital converter whose resolution is less than the system resolution to quantize the error signal and provide a converted difference value. This converted difference value is then added to the predicted or assumed quantity to compute the value of the analog input signal with high resolution and high speed. It is even possible to provide the analog-to-digital converter system according to the invention with the capability to convert multiple independent analog inputs to digital values as shown in FIG. 5. This merely requires the addition of an analog multiplexer 112 and a digital multiplexer 133. The analog multiplexer 112 connects one of the outputs of anti-aliasing filters $111_I$ to $111_n$ to the sample and hold amplifier 18 and the differencing circuit 12. The digital prediction and computation logic 17 is provided with a plurality of accumulators for separately storing digital values. The outputs of these accumulators are supplied to the digital multiplexer which connects the output of the accumulator corresponding to the selected input filter to the digital-to-analog converter 13. The timing and control circuits 20 can control the multiplexers 112 and 133 in either a sequential or random order to select the active channel of the analog multiplexer 112 and the accumulator which is to be used.

We claim:

1. An analog-to-digital converter system for converting a rapidly changing analog signal to a very high resolution quantized digital output value, comprising:

differencing means connected to receive said analog input signal and a predicted analog signal for producing an analog error signal proportional to the difference between said analog input signal and said predicted analog signal;

first sample and hold means connected to receive said analog error signal and providing a sampled output error signal;

a first analog-to-digital converter connected to receive said sampled output error signal and having a resolution of N bits, the resolution of said analog-to-digital converter system being M bits where M is greater than N;

prediction and computation logic means connected to the output of said analog-to-digital converter and including accumulator means, said digital prediction and computation logic means combining the output of said analog-to-digital converter with a value previously stored in said accumulator means, said accumulator means providing an M bit output; and digital-to-analog converter means connected to receive the R highest order bit outputs but less than the M bit outputs of said accumulator means for generating said predicted analog signal.

2. The analog-to-digital converter system as recited in claim 1 further comprising:

a second sample and hold means connected for receiving said analog input signal and providing a sampled output signal, said first and said second sample and hold means having different gains, the gain of said first sample and hold means being greater than that of said second sample and hold means;

selector switch means connected to said first and second sample and hold means for selectively supplying said sampled output error signal or said sampled output signal to said analog-to-digital converter; and level detector means connected to said first sample and hold means for determining whether said sampled output error signal exceeds the range of said analog-to-digital converter, and, if so, generating a control signal to cause said selector switch means to supply to said analog-to-digital converter said sampled output signal instead of said sampled output error signal; said prediction and computation logic means also being responsive to said control signal for digitally dividing the output of said analog-to-digital converter by predetermined amounts to correct for the gains of said first and second sample and hold means.

3. The analog-to-digital converter system as recited in claim 2 wherein said prediction and computation logic means comprises:

a parallel arithmetic logic unit having M pairs of inputs and M outputs with one set of M inputs connected so that the least significant N inputs of that set receive the corresponding outputs of said analog-to-digital converter and the most significant (M-N) inputs of that set receive the sign bit output corresponding to the most significant bit output of said analog-to-digital converter and the other set of M inputs connected so that the least significant (M-R) inputs of that set receive a logic "zero" level while the most significant R inputs of that set receive the corresponding R most significant outputs of said accumulator means and having latch and decoding means receiving "SIGN" and "OVERFLOW" outputs from the arithmetic logic unit and supplying to the aritthmetic logic unit control signals that cause its outputs to be set to the maximum positive or negative digital code values whenever the sum of the two input values to the arithmetic logic unit would exceed the maximum code values; and a multiplexer having M pairs of inputs, one of each of the pairs being connected to a corresponding one of the outputs of said arithmetic logic unit and the other one of each of said pairs being connected such that the N highest order inputs receive the output of said analog-to-digital converter with the remaining (M-N) lowest order inputs receiving a predetermined voltage level, said multiplexer being responsive to said control signal to supply as inputs to said accumulator means one or the other of each of said M pairs of inputs.

4. The analog-to-digital converter system as recited in claim 1 further comprising:

a second sample and hold means connected for receiving said analog error signal and providing a sampled output signal, said first and said second sample and hold means having different gains, the gain of said first sample and hold means being greater than that of said second sample and hold means;

selector switch means connected to said first and second sample and hold means for selectively supplying said sampled output error signal or said sampled output signal to said analog-to-digital converter; and level detector means connected to said first sample and hold means for determining whether said sampled output error signal exceeds the range of said analog-to-digital converter, and, if so, generating a control signal to cause said selector switch means to supply to said analog-to-digital converter said sampled output signal instead of said sampled output error signal; said prediction and computation logic means also being responsive to said control signal for digitally dividing the output of said analog-to-digital converter by predetermined amounts to correct for the gains of said first and second sample and hold means.

5. The analog-to-digital converter system as recited in claim 1 wherein said sample and hold means has a gain of k, where k is greater than unity, and said prediction and computation logic means includes gain scaling means for dividing the output of said analog-to-digital converter by k to correct for the gain of said sample and hold means.

6. The analog-to-digital converter system as recited in claim 5 further comprising:
a second sample and hold means having a gain of unity and connected to receive said analog input signal and providing a sampled output signal;

selector switch means connected to the first and said second sample and hold means for selectively supplying said sampled output error signal or said sampled output signal to said analog-to-digital converter in response to a control signal; and level detector means connected to said first sample and hold means for determining whether said sampled output error signal exceeds the range of said analog-to-digital converter and generating said control signal.

7. The analog-to-digital converter system as recited in claim 5 further comprising:
a second sample and hold means having a gain of one half and connected to receive said analog error signal and providing a sampled output signal;

selector switch means connected to the first and said second sample and hold means for selectively supplying said sampled output error signal or said sampled output signal to said analog-to-digital converter in response to a control signal; and level detector means connected to said first sample and hold means for determining whether said sampled output error signal exceeds the range of said analog-to-digital converter and generating said control signal.

8. The analog-to-digital converter system recited in claim 1 wherein said prediction and computation logic means further includes overflow detection and sign correction means.

9. The analog-to-digital converter system recited in one of claims 2, 4, 6 or 7 wherein said level detector means includes timing means connected to provide an extended release time for said control signal which indicates an out-of-range condition.

10. The analog-to-digital converter system recited in claim 1 further comprising:
a second sample and hold means connected for receiving said analog input signal and providing a sampled output signal, said first and said second sample and hold means having different gains, the gain of said first sample and hold means being greater than that of said second sample and hold means;

a second analog-to-digital converter connected to receive said sampled output signal from said second sample and hold means and having a resolution of N bits; and level detector means connected to said first sample and hold means for determining whether said sampled output error signal exceeds the range of said first analog-to-digital converter; said prediction and computation logic being responsive to the output of said level detector means to utilize the digital output of one or the other of said first or second analog-to-digital converters.

11. The analog-to-digital converter system recited in claim 1 further comprising:
a second sample and hold means connected for receiving said analog error signal and providing a sampled output signal, said first and said second sample and hold means having different gains, the gain of said first sample and hold means being greater than that of said second sample and hold means;

a second analog-to-digital converter connnected to receive said sampled output signal from said second sample and hold means and having a resolution of N bits; and level detector means connected to said first sample and hold means for determining whether said sampled output error signal exceeds the range of said first analog-to-digital converter; said prediction and control logic being responsive to the output of said level detector means to utilize the digital output of one or the other of said first or second analog-to-digital converters.

12. The analog-to-digital converter system recited in claim 2 or 6 further comprising:
a plurality of input anti-aliasing filters;

a multiple channel analog multiplexer for connecting the output of a selected one of said filters to said second sample and hold means and said differencing means;

said prediction and computation logic means having a plurality of accumulator means, one for each of the channels provided by said multiplexer;

a digital multiplexer for connecting the output of the one of said plurality of accumulator means corresponding to the selected input filter to said digital-to-analog converter; and control and timing means for controlling said analog multiplexer and said digital multiplexer thereby providing the capability to convert multiple independent analog intputs to digital values.

* * * * *

UNITED STATES PATENT AND TRADEMARK OFFICE
CERTIFICATE OF CORRECTION

PATENT NO. : 4,308,524
DATED : December 29, 1981
INVENTOR(S) : William David Harrison et al It is certified that error appears in the above—identified patent and that said Letters Patent is hereby corrected as shown below:

Column 6, line 44, change "SN74LS383" to --SN74LS382--.

Signed and Sealed this

First Day of June 1982

[SEAL]

Attest:

Attesting Officer

GERALD J. MOSSINGHOFF

Commissioner of Patents and Trademarks